(12) United States Patent
Dong et al.

(10) Patent No.: US 8,470,673 B2
(45) Date of Patent: Jun. 25, 2013

(54) METHOD OF FABRICATING SEMICONDUCTOR DEVICE WITH BURIED BIT LINE

(75) Inventors: Cha-Deok Dong, Gyeonggi-do (KR); Gyu-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 287 days.

(21) Appl. No.: 12/841,845

(22) Filed: Jul. 22, 2010

(65) Prior Publication Data

US 2011/0284942 A1    Nov. 24, 2011

(30) Foreign Application Priority Data

May 20, 2010    (KR) .................. 10-2010-0047521

(51) Int. Cl.
*H01L 21/8239* (2006.01)
(52) U.S. Cl.
USPC ............ 438/272; 438/586; 257/E21.657
(58) Field of Classification Search
USPC ................................................ 438/272
See application file for complete search history.

(56) References Cited

U.S. PATENT DOCUMENTS

| 2002/0066925 A1 | 6/2002 | Gruening et al. |
| 2008/0124869 A1* | 5/2008 | Yoon et al. ................... 438/268 |
| 2011/0129975 A1* | 6/2011 | Lee ............................ 438/270 |

FOREIGN PATENT DOCUMENTS

| JP | 2006-000945 | 1/2006 |
| KR | 1020090000444 | 1/2009 |
| KR | 1020090099409 | 9/2009 |

OTHER PUBLICATIONS

Notice of Allowance issued by the Korean Intellectual Property Office on Mar. 29, 2012.
Notice of Preliminary Rejection issued from Korean Intellectual Property Office on Jun. 30, 2011.

* cited by examiner

*Primary Examiner* — Stephen W Smoot
(74) *Attorney, Agent, or Firm* — IP & T Group LLP

(57) ABSTRACT

A semiconductor device includes an active region having a sidewall, which has a sidewall step, a junction formed under a surface of the sidewall step, and a buried bit line configured to contact the junction.

24 Claims, 16 Drawing Sheets

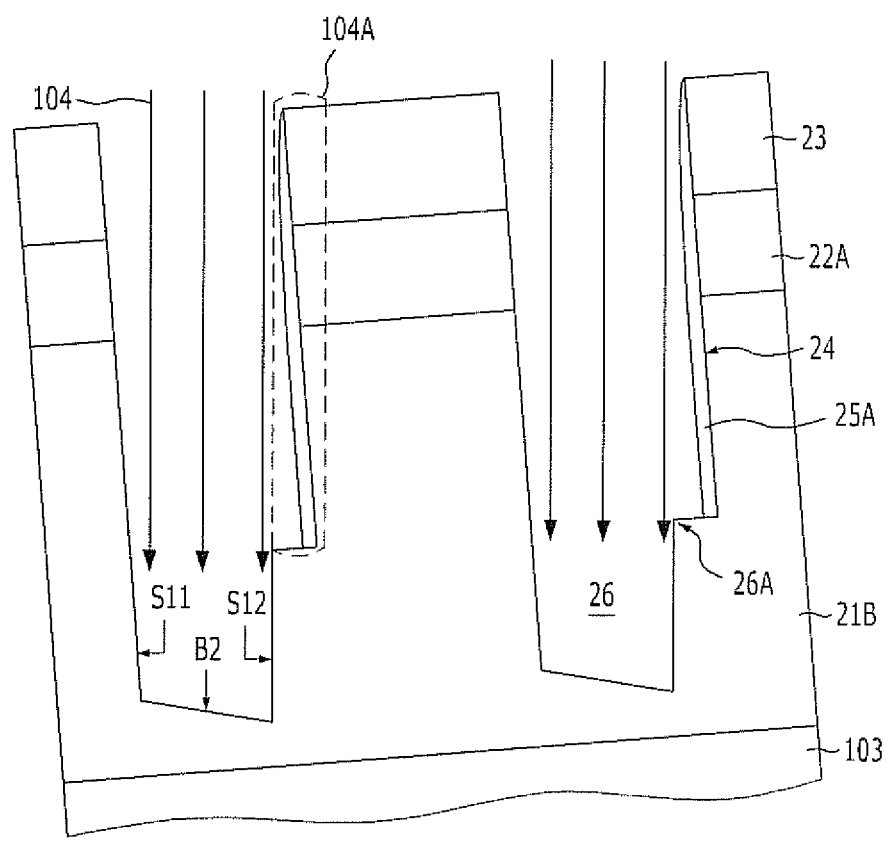

METHOD OF FABRICATING SEMICONDUCTOR DEVICE WITH BURIED BIT LINE

CROSS-REFERENCE TO RELATED APPLICATIONS

The present application claims priority of Korean Patent Application No. 10-2010-0047521, filed on May 20, 2010, which is incorporated herein by reference in its entirety.

BACKGROUND OF THE INVENTION

Exemplary embodiments of the present invention relate to a semiconductor device and a fabrication method thereof, and more particularly, to a semiconductor device with buried bit lines and a method for fabricating the same.

In order to decrease the size of a memory device, three-dimensional (3D) cells of $4F^2$ (where F denotes a minimum feature size) are under development. Examples of the 3D cells include vertical cells.

A vertical cell includes a pillar-type active region, a buried bit line filling a portion of a trench that isolates the active region, and a vertical gate formed on a sidewall of the active region.

FIG. 1 is a cross-sectional view illustrating vertical cells of a known semiconductor device.

Referring to FIG. 1, a plurality of active regions 12 are formed over a substrate 11. Each active region 12 has a plurality of sidewalls, and each sidewall has a vertical profile. The inside of a trench 13, which isolates neighboring active regions 12, is partially filled with a buried bit line 14. Also, a junction 15 is formed on each active region 12. The junction 15 contacts the buried bit line 14. An insulation layer 16 provides a contact portion between the junction 15 and the buried bit line 14, and the insulation layer 16 covers the surface of each active region 12 and each hard mask layer 17.

The junction 15 is formed at a portion of any one sidewall of the active region 12 in order to form the metallic buried bit line 14 that stably contacts the junction 15. Also, since the buried bit line 14 has a shape filling the lower portion of the trench 13, the height of the junction 15 should be positioned in the lower portion of the sidewall of the active region 12.

However, it is difficult to consistently create a junction 15 at a certain height along any one sidewall of each of the active regions 12.

In order to do so, a great number of mask processes and other fabrication processes may be required. In particular, as the size of semiconductor devices decreases, misalignment of the junctions 15 in each of the active regions 12 may occur more often. Also, attempting to align the junctions 15 in each of the active regions 12 may be disadvantageous in terms of throughput because difficult processes, such as stripping, deposition, and etching, are repeatedly performed.

Moreover, since the active regions 12 are formed to have a predetermined height with a narrow space between them, it is even more difficult to form the junction 15 on a portion of one sidewall of the active regions 12. Forming the junction 15 may require a tilt ion implantation process. To perform the tilt ion implantation process, the substrate 11, having the active regions 12 and trenches 13, is placed at an angle with respect to the ion implantation process. Because the space between the active regions 12 is narrow, a shadow effect may occur during the tilt ion implantation process. Due to the shadow effect, ions may not be implanted into a target position and the depth of the junction 15 may not be uniform.

SUMMARY OF THE INVENTION

An embodiment of the present invention is directed to a semiconductor device that may achieve stable contact between a buried bit line and a junction, and a method for fabricating the same.

Another embodiment of the present invention is directed to a semiconductor device that may have a junction contacting a buried bit line at a uniform depth, and a method for fabricating the same.

In accordance with an embodiment of the present invention, a semiconductor device includes an active region having a sidewall, which has a sidewall step, a junction formed under a surface of the sidewall step, and a buried bit line configured to contact the junction.

A neighboring active region may be separated by a trench, and the buried bit line may fill a portion of the trench. The active region may be isolated by a first trench and a second trench and one sidewall of the first trench and one sidewall of the second trench may be aligned to have vertical profiles, and another sidewall of the first trench and another sidewall of the second trench may provide the sidewall step.

In accordance with another embodiment of the present invention, a method for fabricating a semiconductor device includes forming a trench having a sidewall step on one sidewall by etching a substrate, forming a junction under a surface of the sidewall step, and forming a buried bit line contacting the junction.

The forming the junction may be performed by an ion implantation process. The forming of the trench may include forming a first trench by performing a primary trench etch process onto the substrate, and forming a second trench for providing the sidewall step to a portion connected to the first trench by etching the substrate deeper than the first trench through a secondary trench etch process. The primary trench etch process and the secondary trench etch process may be anisotropic etch processes. The secondary trench etch process may be performed by tilting the substrate.

In accordance with yet another embodiment of the present invention, a method for fabricating a semiconductor device includes forming a first trench by etching a substrate, forming a sacrificial layer that exposes one sidewall of the first trench and a portion of a bottom of the first trench, forming a second trench that provides a sidewall step by etching the exposed portion of the bottom of the first trench, forming a junction under a surface of the sidewall step, and forming a buried bit line contacting the junction.

BRIEF DESCRIPTION OF THE DRAWINGS

FIGS. 3A to 3J are cross-sectional views illustrating a method for fabricating the semiconductor device of FIG. 2.

DESCRIPTION OF SPECIFIC EMBODIMENTS

Figure 1:
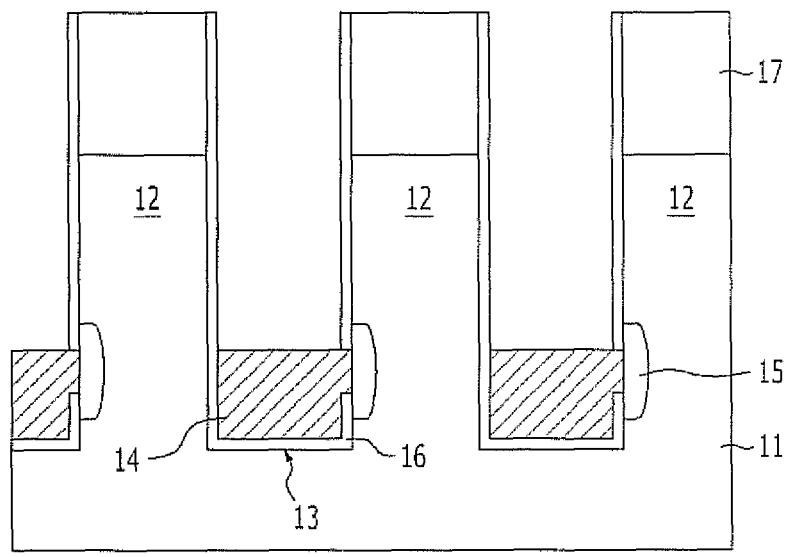
FIG. 1 is a cross-sectional view illustrating vertical cells of a known semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2:
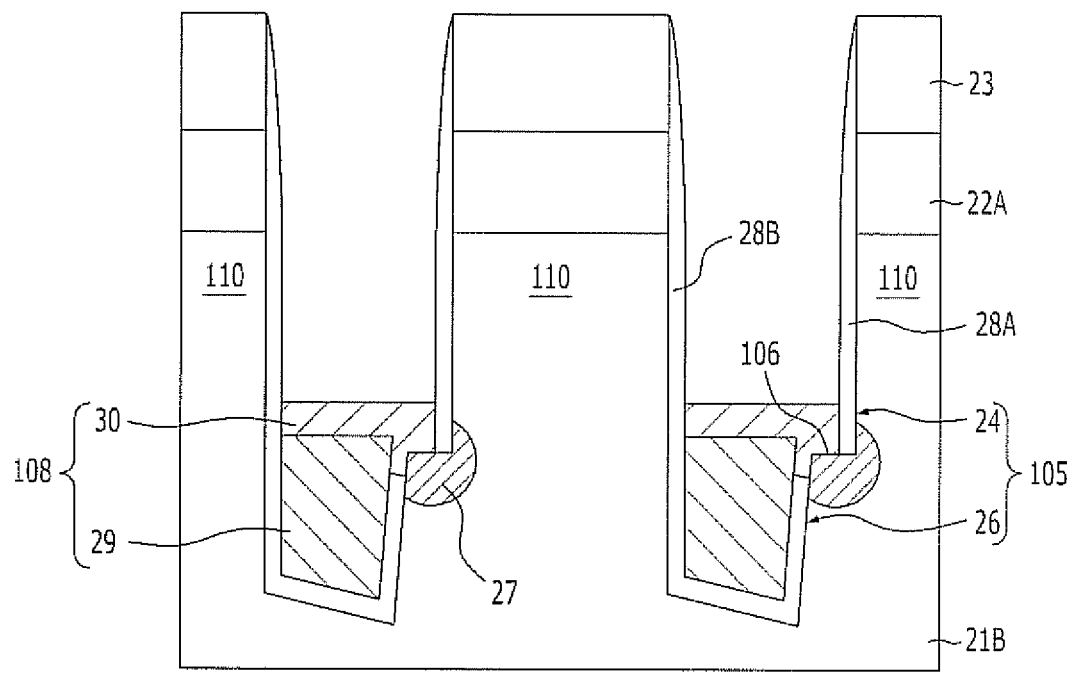
FIG. 2 is a cross-sectional view illustrating a structure of a semiconductor device in accordance with a first embodiment of the present invention.

FIG. 2 is a cross-sectional view illustrating a structure of a semiconductor device in accordance with a first embodiment of the present invention.

Referring to FIG. 2, a trench 105 is formed to isolate a plurality of neighboring active regions 110 over a substrate 21B. The trench 105 has a double structure, including a first trench 24 and a second trench 26 that are extended in a depth direction. Each of the active regions 110 has a plurality of sidewalls, and one sidewall of the plurality of the sidewalls has a sidewall step 106. From the perspective of the trench 105, any one sidewall of the trench 105 has the sidewall step 106. A junction 27 is formed at the surface of the sidewall step 106, and a buried bit line 108 is formed to contact the junction 27. The junction 27 may include a source or a drain into which impurity ions are implanted. The buried bit line 108 fills a portion of the trench 105 between the active regions 110. The buried bit line 108 includes a first conductive layer 29 and a second conductive layer 30. The buried bit line 108 fills a portion of the trench 105, so that it covers an edge of the sidewall step 106. The first conductive layer 29 may include a polysilicon layer, and the second conductive layer 30 may include a metal layer. Further, blocking layers 28A and 28B may be formed inside the trench 105 in order to cover the sidewalls of the active region 110 while exposing a portion of the junction 27. Also, a pad layer pattern 22A and a hard mask pattern 23 may be stacked over the active regions 110.

FIGS. 3A to 33 are cross-sectional views illustrating a method for fabricating the semiconductor device of FIG. 2.

Figure 3A:
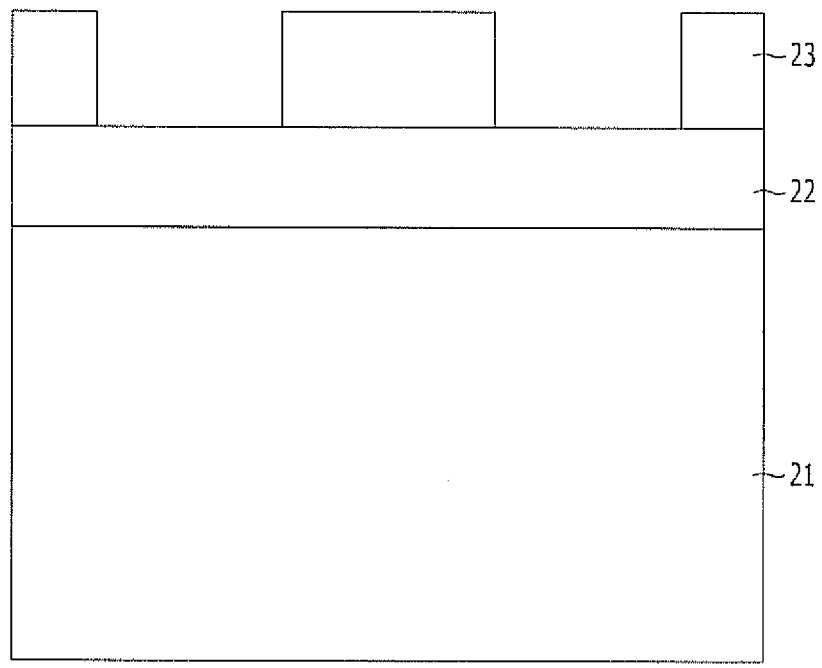

Referring to FIG. 3A, a pad layer 22 is formed over a substrate 21. The substrate 21 may be a silicon substrate. The pad layer 22 includes at least one material selected from the group consisting of an oxide layer, a nitride layer, and a polysilicon layer. For example, the pad layer 22 may be a double layer, which is formed by stacking an oxide layer and a nitride layer or stacking an oxide layer and a polysilicon layer.

A hard mask pattern 23 is formed over the pad layer 22. The hard mask pattern 23 is formed by forming a hard mask layer over the pad layer 22, and etching the hard mask layer using a trench mask (not shown) as an etch barrier. The hard mask pattern 23 has a sufficient thickness to function as an etch barrier for two subsequent trench etch processes. Also, the hard mask pattern 23 has a sufficient etch resistance and etch selectivity for obtaining a vertical profile during a subsequent tilt etching process. Herein, tilt etching refers to a secondary trench etch process, which is the second of two subsequent trench etch processes. The hard mask pattern 23 may include an oxide layer or a nitride layer.

Figure 3B:
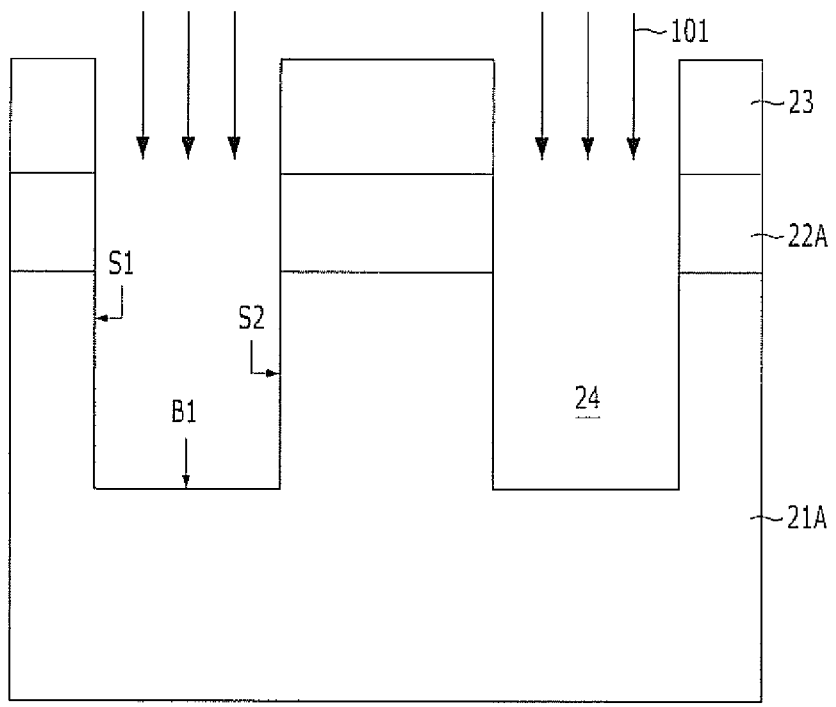

Referring to FIG. 3B, a primary trench etch process 101 is performed using the hard mask pattern 23 as an etch barrier. For example, the pad layer 22 is etched using the hard mask pattern 23 as an etch barrier, and subsequently a first trench 24 is formed by etching the substrate 21 to a certain depth. The first trench 24 may be a line-type trench. That is, the first trench 24 may have a linear shape extending in a direction perpendicular to the cross-section shown in FIG. 3B.

The primary trench etch process 101 may be an anisotropic etch, which is capable of etching in a straight line. Accordingly, the primary trench etch process 101 can produce a trench with vertical sidewalls. When the substrate 21 is a silicon substrate, the anisotropic etch may include a plasma dry etch process performed using chlorine ($Cl_2$) or hydrobromide (HBr) gas alone or a mixed gas thereof.

The first trench 24 is formed to have a certain first depth. For example, the first depth may be approximately half the depth of the final trench 105. The remaining depth of the final trench 105 is determined by a second trench 26 to be formed subsequently. The sidewalls of the first trench 24 have a vertical profile. As shown in FIG. 3B, the first trench 24 has a first sidewall S1, a second sidewall S2, and a bottom surface B1. The first sidewall S1 and the second sidewall S2 have vertical profiles. After the formation of the first trench 24, the substrate is denoted with reference numeral '21A,' and the pad layer is denoted with reference numeral '22A.' After the formation of the first trench 24, the hard mask pattern 23 has a sufficient thickness remaining in order to function as an etch barrier during a secondary trench etch process to be performed after the primary trench etch process.

Figure 3C:
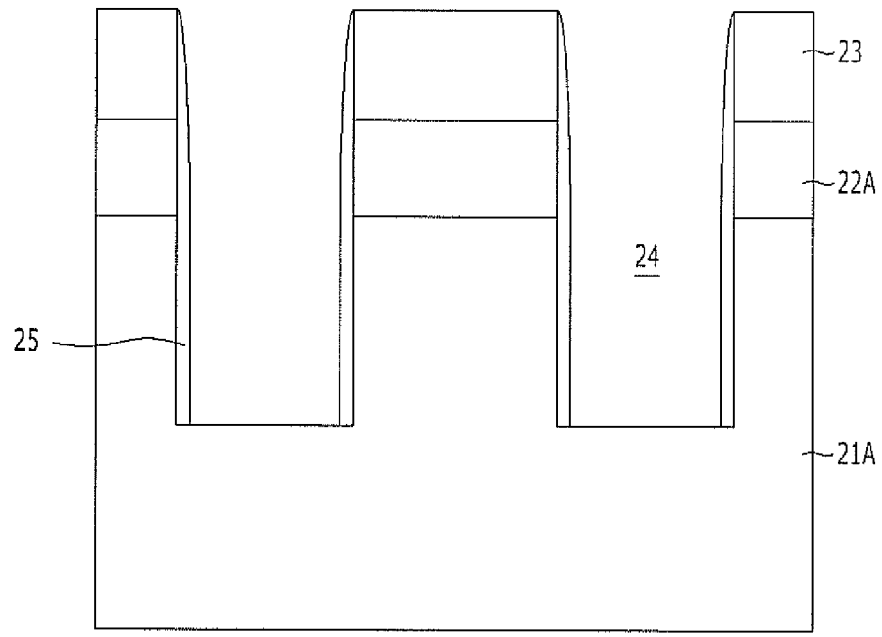

Referring to FIG. 3C, a spacer 25 is formed to cover the first sidewall S1 and the second sidewall S2 of the first trench 24, and expose the bottom surface B1 of the first trench 24. The spacer 25 is formed by depositing a thin insulation layer over the substrate 21A and performing an etch-back process. The spacer 25 includes an oxide layer or a nitride layer. For example, the spacer 25 may include a silicon oxide ($SiO_2$) or a silicon nitride ($Si_3N_4$). The thickness of the spacer 25 determines the width of a subsequently formed sidewall step. The spacer 25 may also be formed on the sidewalls of the pad layer pattern 22A and the hard mask pattern 23.

Figure 3D:
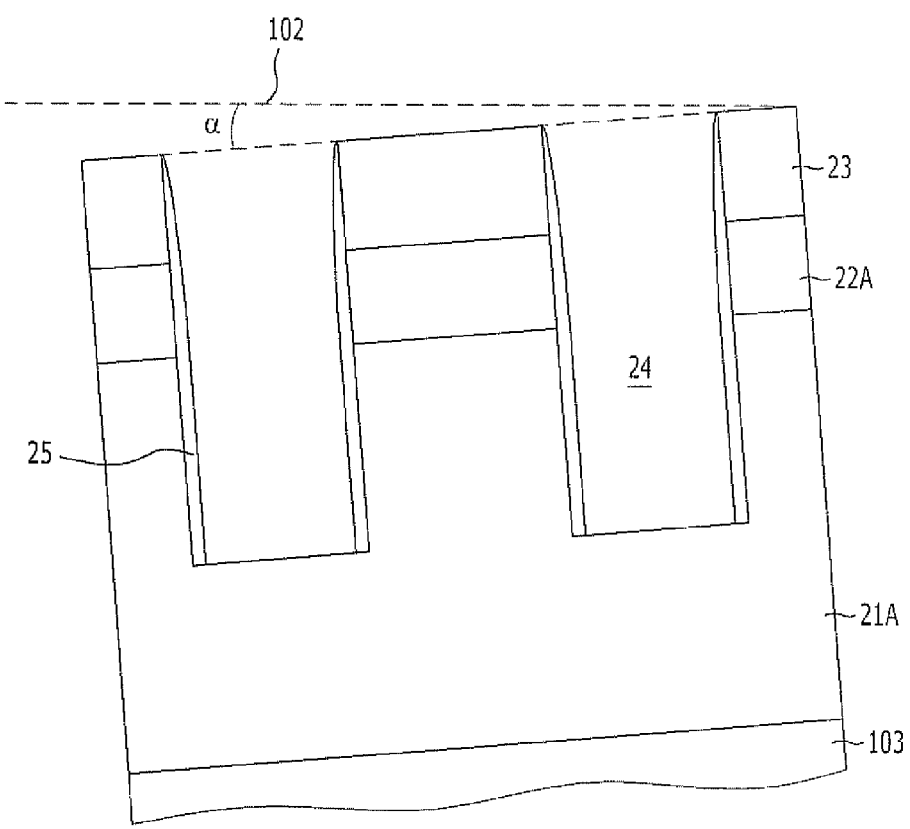

Referring to FIG. 3D, the substrate 21A is tilted at a certain angle. A stage 103 of an etch device may be used to tilt the substrate 21A. In other words, a tilt angle a is adjusted by tilting the stage 103 holding the substrate 21A at a certain angle. The tilt angle a ranges from approximately 4° to approximately 10° with respect to a horizontal surface 102.

Referring to FIG. 3E, a secondary trench etch process 104 is performed onto the tilted substrate 21A. The secondary trench etch process 104 may be the same anisotropic etch process, which is capable of etching in a straight line, as the primary trench etch process 101. Further, as shown in FIG. 3E, the secondary trench etch process 104 etches in the same direction as the primary trench etch process 101, however, when performing the secondary trench etch process 104, the substrate 21A is tilted at a certain angle. Since the substrate 21A is tilted, a shadow effect 104A occurs, such that a certain region is not etched. That is, because of the tilt, the secondary trench etch process 104 does not etch a certain region, thereby creating a shadow effect 104A. When the substrate 21A is a silicon substrate, the anisotropic etch process includes a plasma dry etch process performed using chlorine ($Cl_2$) or hydrobromide (HBr) gas alone, or a mixed gas thereof.

Through the secondary trench etch process 104, a second trench 26 including a first sidewall S11, a second sidewall S12, and a bottom surface B2 is formed. The substrate with the second trench 26 is denoted with reference numeral '21B.' During the formation of the second trench 26, a spacer 25 may be etched in a region where the shadow effect 104A does not occur. Accordingly, as shown in FIG. 3E, the first sidewall S11 of the second trench 26 is etched, so that the first sidewall S11 of the second trench 26 has a vertical profile aligned with the first sidewall S1 (see FIG. 3B) of the first trench 24. However, the second sidewall S12 of the second trench 26 is not aligned with the second sidewall S2 (see FIG. 3B) of the first trench 24, and the spacer 25 remains on the second sidewall S2 of the first trench 24. Also, due to the shadow effect 104A, shoulder portions 26A are formed between the second sidewall S2 of the first trench 24 and the second sidewall S12 of the second trench 26. Further, the second sidewall S12 of the second trench 26 may have a slope profile.

The secondary trench etch process 104 for forming the second trench 26 may be an asymmetric etch process. Accordingly, the first sidewall S11 of the second trench 26 may have a vertical profile, while the second sidewall S12 of the second trench 26 has a slope profile. The angle of the second sidewall S12 of the second trench 26 may be the same as the tilt angle of the substrate 21B. The bottom surface B2 of the second trench 26 may also be sloped at an angle as well. For example, the angle of the bottom surface B2 of the second trench 26 may be the same as the tilt angle of the substrate 21B.

Figure 3F:
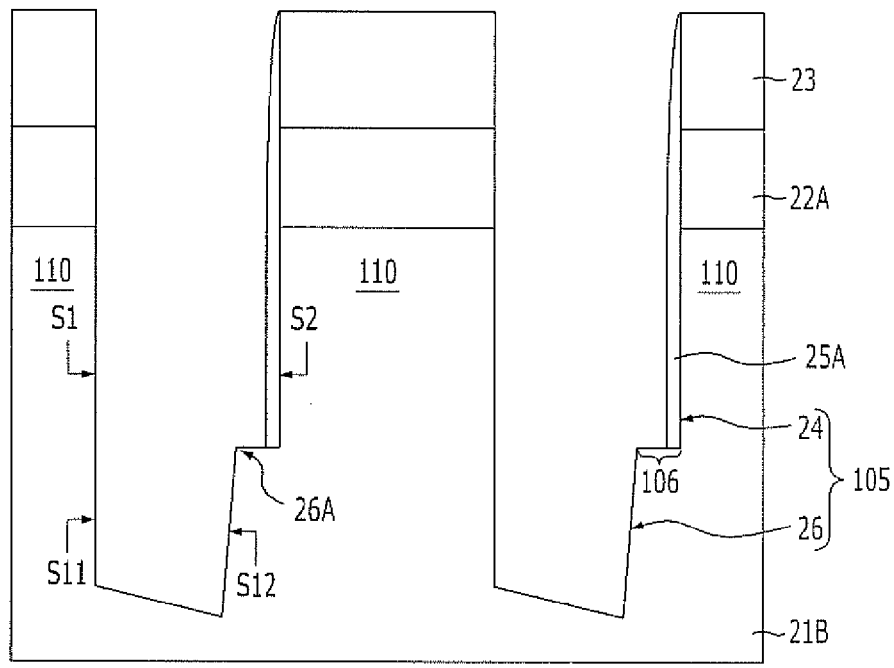

Referring to FIG. 3F, the substrate 21B is tilted back to a horizontal state. This may be done using the stage 103 (not shown in FIG. 3F).

FIG. 3F shows the substrate 21B having a double-structure trench 105, including the first trench 24 and the second trench 26. Where the substrate 21B is in the horizontal state, as shown in FIG. 3F, the first sidewall S1 and the second sidewall S2 of the first trench 24 have vertical profiles. Moreover, the first sidewall S11 of the second trench 26 has a vertical profile, while the second sidewall S12 has a slope profile. Furthermore, the first sidewall S1 of the first trench 24 is aligned with the first sidewall S11 of the second trench 26. The shoulder portions 26A of the second trench 26 are exposed, and the sidewall step 106 is formed between the first trench 24 and the second trench 26 due to the shoulder portions 26A. The sidewall step 106 is in a region where a junction is to be formed in a subsequent ion implantation process. The spacer 25A remains on the second sidewall S2 of the first trench 24 above the sidewall step 106.

As described above, the double-structure trench 105 includes a sidewall step 106 formed on any one sidewall. The double-structure trench 105 is a region to be filled with a bit line. In particular, the second trench 26 of the double-structure trench 105 is filled with the bit line. The double-structure trench 105 defines a plurality of active regions 110. In other words, neighboring active regions 110 are isolated from each other by the double-structure trench 105. The active regions 110 have a pillar structure. Each of the active regions 110 includes a plurality of sidewalls and any one of the plurality of the sidewalls has the sidewall step 106.

Figure 3G:
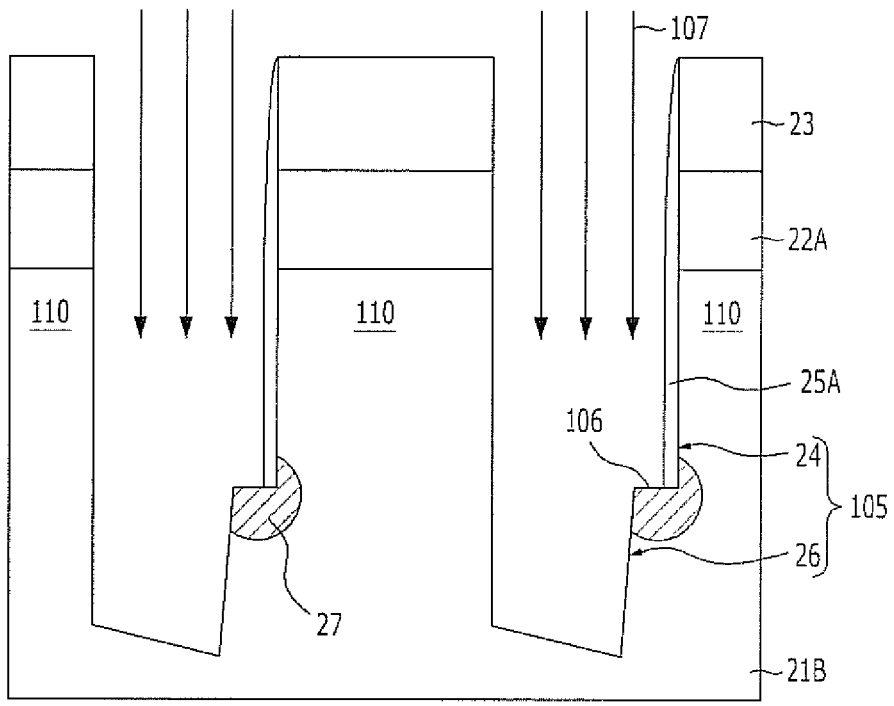

Referring to FIG. 3G, an ion implantation process 107 is performed onto the substrate 21B. As a result, ions are implanted into the substrate 21B at the sidewall step 106. The ion implantation process 107 is performed using an N-type impurity or a P-type impurity. The N-type impurity may include phosphorus (P) or arsenic (As), and the P-type impurity may include boron (B). Through the ion implantation process 107, a junction 27 is formed under the surface of the sidewall step 106. Since the sidewall step 106 is exposed, a tilt ion implantation process is not needed. Therefore, the junction 27 may be more easily formed through the ion implantation process 107, which implants ions in a vertical direction. Meanwhile, the ion implantation process 107 may be performed onto the bottom of the double-structure trench 105. However, since the ion implantation process 107 is performed with an ion implantation energy according to the depth of the junction 27 inside the double-structure trench 105, few ions are implanted into the bottom of the double-structure trench 105. Also, even if ions are implanted into the bottom of the double-structure trench 105, they are not electrically connected to the junction 27. Since the amount of ions implanted into the bottom of the double-structure trench 105 is minute, the implanted ions may be removed through a subsequent cleaning process.

Subsequently, annealing is performed to activate the impurity. As a result, the junction 27 may be extended to the lower portion of the second sidewall S2 of the first trench 24.

Figure 3H:
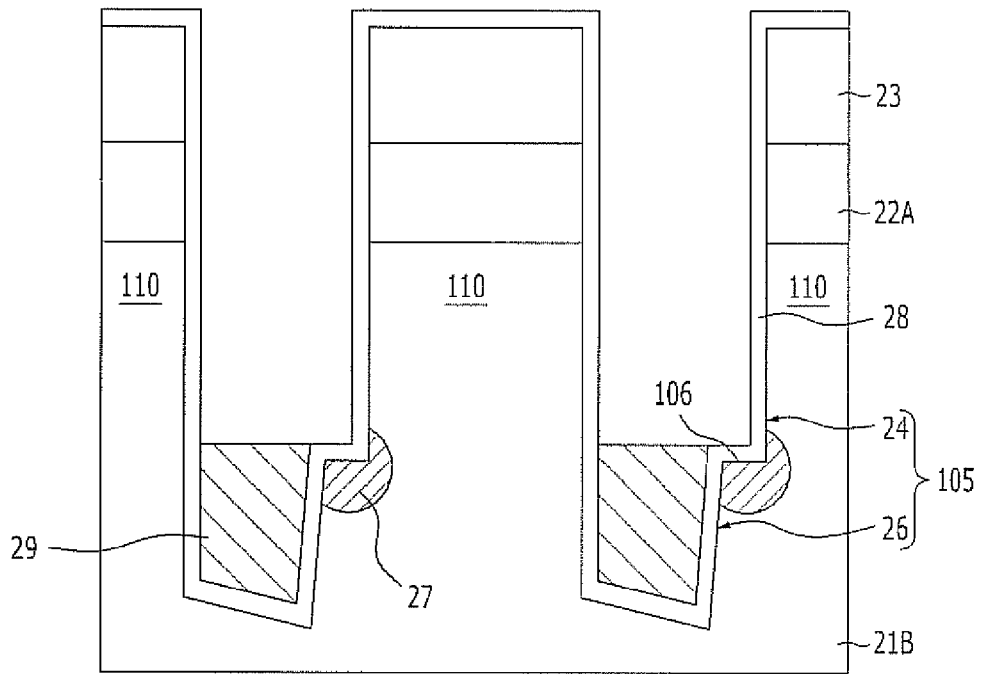

Referring to FIG. 3H, the remaining spacer 25A is removed. Subsequently, a blocking layer 28 is formed over a resultant substrate structure 21B, including the double-structure trench 105. The blocking layer 28 includes an insulation layer, such as an oxide layer or a nitride layer.

A first conductive layer 29 is deposited over the blocking layer 28, and then an etch-back process is performed. Here, an etch target and etch time of the etch-back process are controlled to expose the blocking layer 28 over the sidewall step 106. Since the etch-back process is performed to expose the blocking layer 28 over the sidewall step 106, a sufficient portion of the first conductive layer 29 may remain to gap-fill the second trench 26.

Figure 3I:
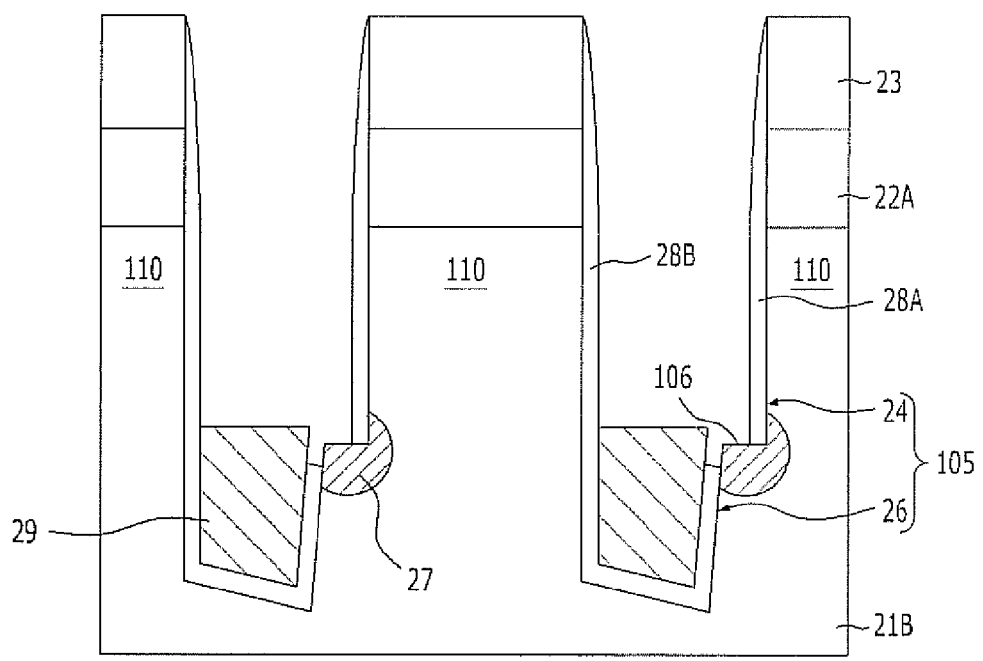

Referring to FIG. 3I, the blocking layer 28 is etched to expose a portion of the sidewall step 106. To expose a portion of the sidewall step 106, a dry etch process may be used. Herein, a known etch-back process may be performed. Due to the characteristics of the etch-back process, a portion of the blocking layer 28 may remain in the form of a spacer. Herein, the portion of the blocking layer forming a spacer is denoted with reference numeral 28A. The spacer-type remaining blocking layer 28A is formed on the second sidewall S2 of the first trench 24. The other remaining portion of the blocking layer 28B is formed on the first sidewall S1 of the first trench 24, on the first and second sidewalls S11 and S12 of the second trench 26, and on the bottom surface of the double-structure trench 105. Since a portion of the sidewall step 106 is exposed, a portion of the junction 27 is exposed. The junction 27 may have two flat surfaces that are exposed. More specifically, the junction 27 may have a top surface, which is perpendicular to the second sidewall S2, and a side surface, which forms a part of the second sidewall S12 of the second trench 26.

Figure 3J:
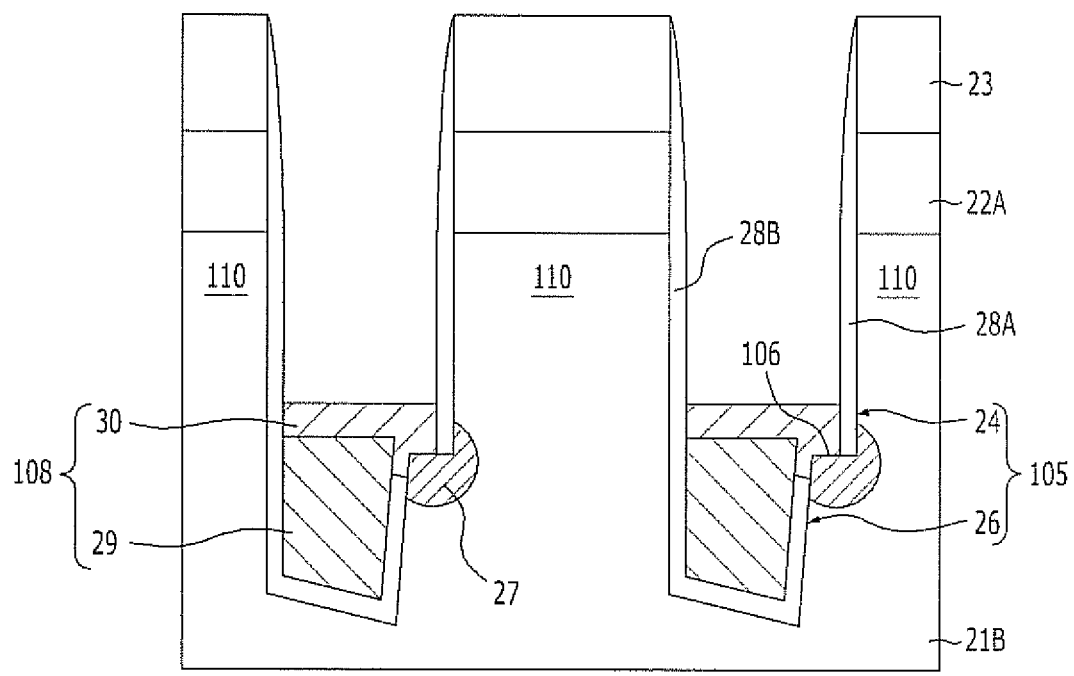

Referring to FIG. 3J, a second conductive layer 30 contacting the junction 27 is formed. The second conductive layer 30 includes a metal layer. The second conductive layer 30 is formed by depositing a layer over the substrate structure and then performing an etch-back process so as to fill a portion of the double-structure trench 105.

When the second conductive layer 30 is formed as described above, a buried bit line 108, including the first conductive layer 29 and the second conductive layer 30, is formed. The buried bit line 108 contacts the junction 27 through the second conductive layer 30. The other portion of the buried bit line 108 except the portion contacting the junction 27 is insulated by the blocking layer 28A and 28B from the substrate 21B and the active regions 110.

As a modified example of the first embodiment of the present invention, the ion implantation process 107 for forming the junction 27 may be performed before the formation of the second conductive layer 30. In other words, processes may be performed up to the process shown in FIG. 3I so as to expose a portion of the sidewall step 106 and the junction 27 may be formed by performing an ion implantation process. Subsequently, the second conductive layer 30 is formed to contact the junction 27.

Figure 4:
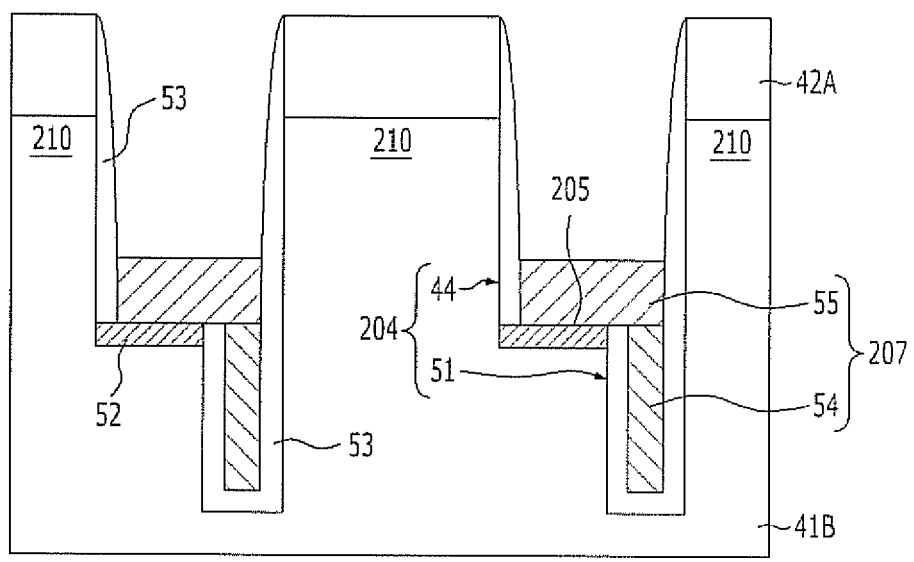
FIG. 4 is a cross-sectional view illustrating a structure of a semiconductor device in accordance with a second embodiment of the present invention.

FIG. 4 is a cross-sectional view illustrating a structure of a semiconductor device in accordance with a second embodiment of the present invention.

Referring to FIG. 4, a trench 205 is formed to isolate a plurality of neighboring active regions 210 over a substrate 41B. The trench 204 has a double structure, including a first trench 44 and a second trench 51 that are extended in a depth direction. Each of the active regions 210 has a plurality of sidewalls, and one sidewall of the plurality of the sidewalls has a sidewall step 205. From the perspective of the trench 204, any one sidewall of the trench 204 has the sidewall step 205. A junction 52 is formed at the surface of the sidewall step 205, and a buried bit line 207 is formed to contact the junction 52. The junction 52 may include a source or a drain into which impurity ions are implanted. The buried bit line 207 fills a portion of the trench 204 between the active regions 210. The buried bit line 207 includes a first conductive layer 54 and a second conductive layer 55. The first conductive layer 54 may include a polysilicon layer, and the second conductive layer 55 may include a metal layer. The second conductive layer 55 covers the surface of the sidewall step 205. The trench 204 further includes a blocking layer 53 which covers the sidewalls of the active regions 210 and exposes a portion of the junction 52.

Figure 5A:
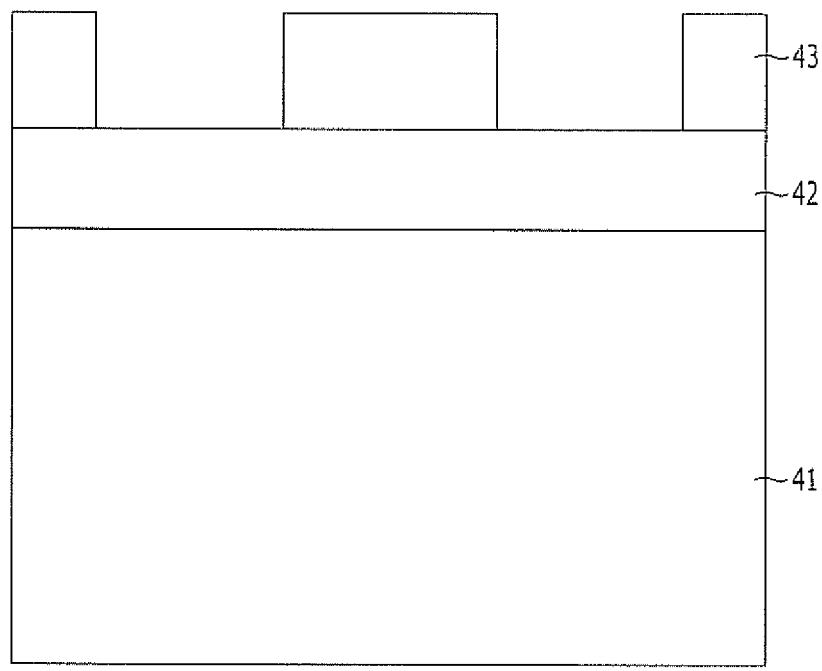
FIGS. 5A to 5N are cross-sectional views illustrating a method for fabricating the semiconductor device of FIG. 4.
Figure 5B:
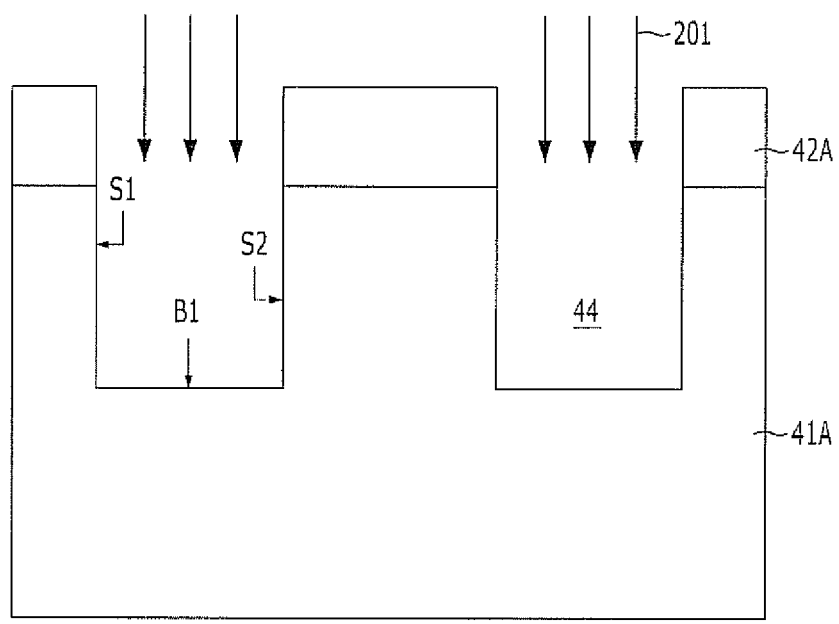
Figure 5C:
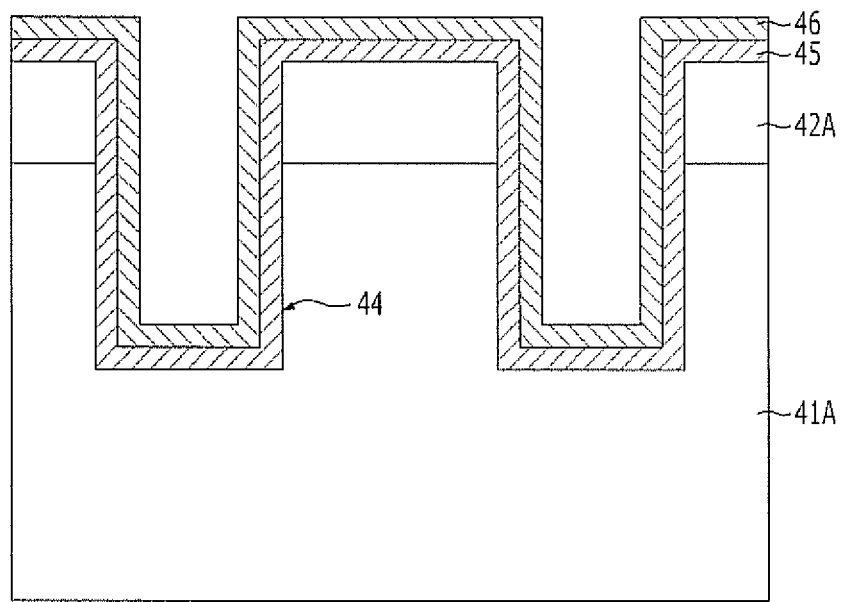
Figure 5D:
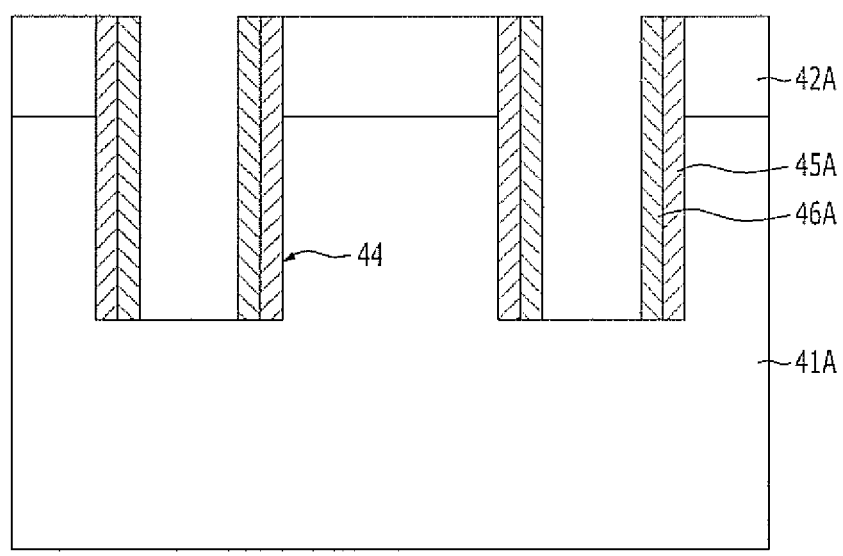
Figure 5E:
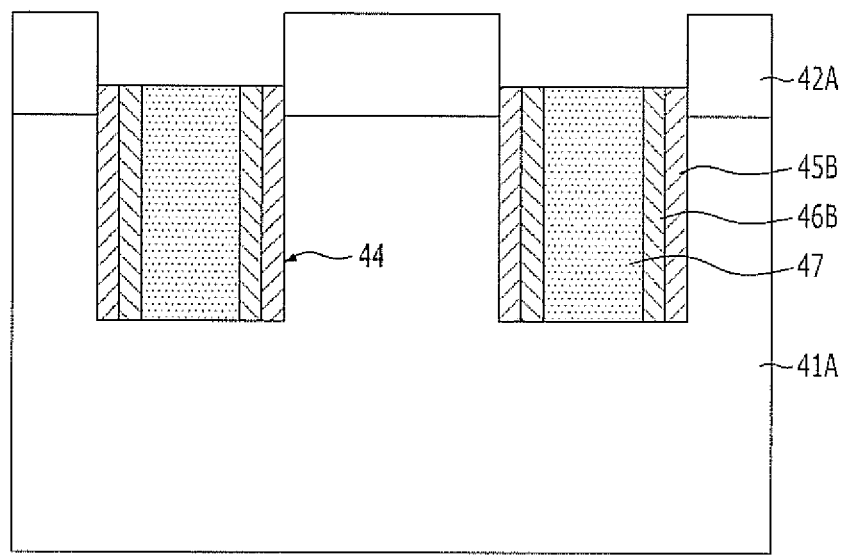
Figure 5F:
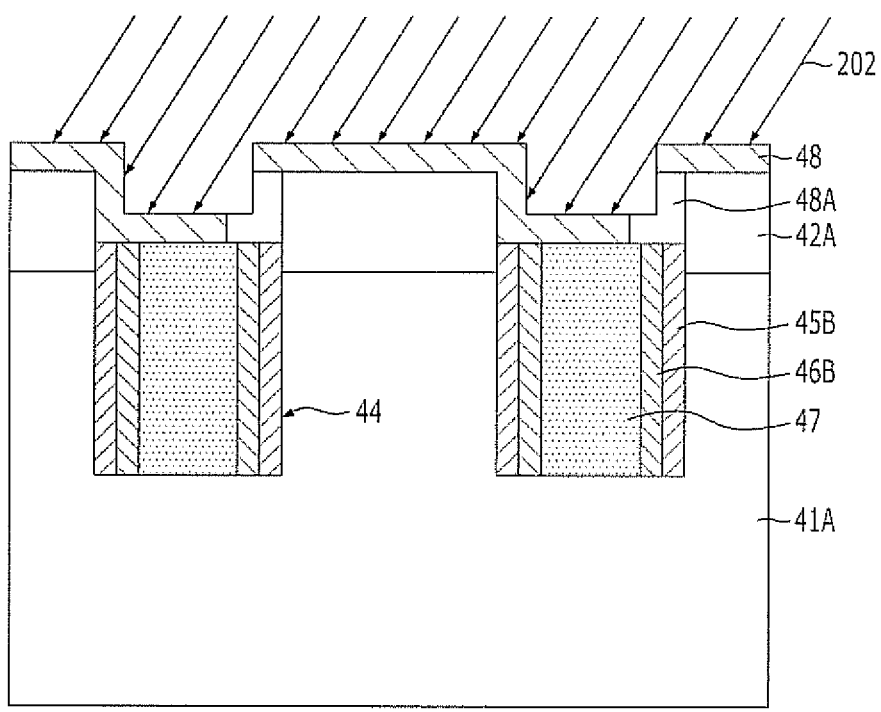
Figure 5G:
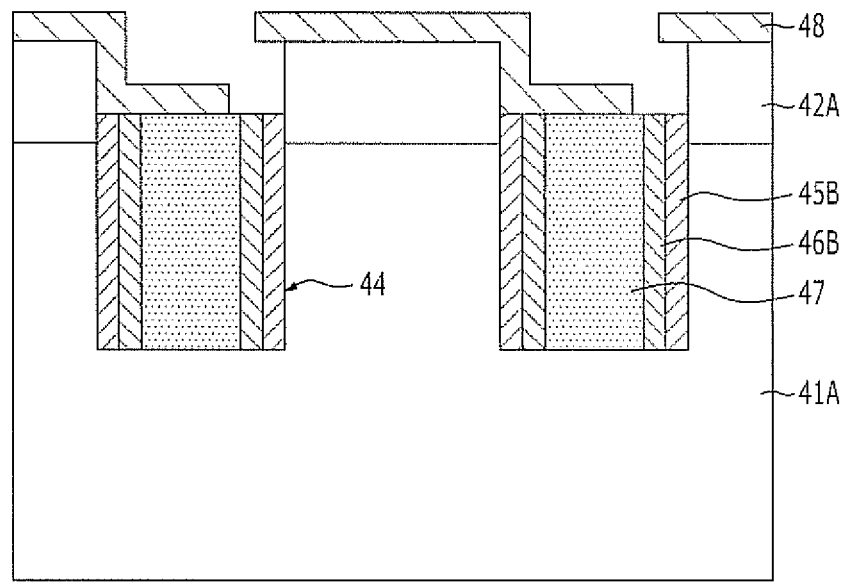
Figure 5H:
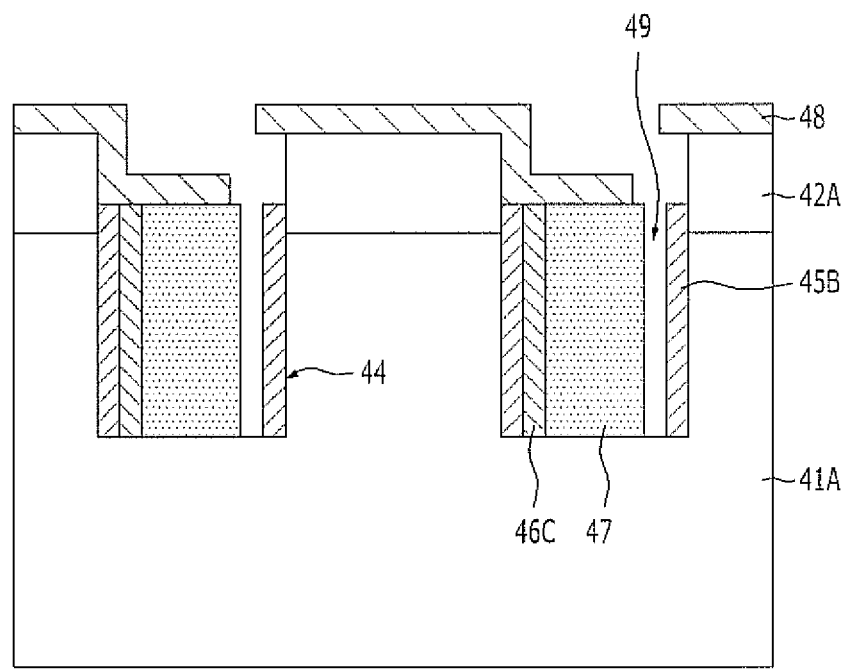
Figure 5I:
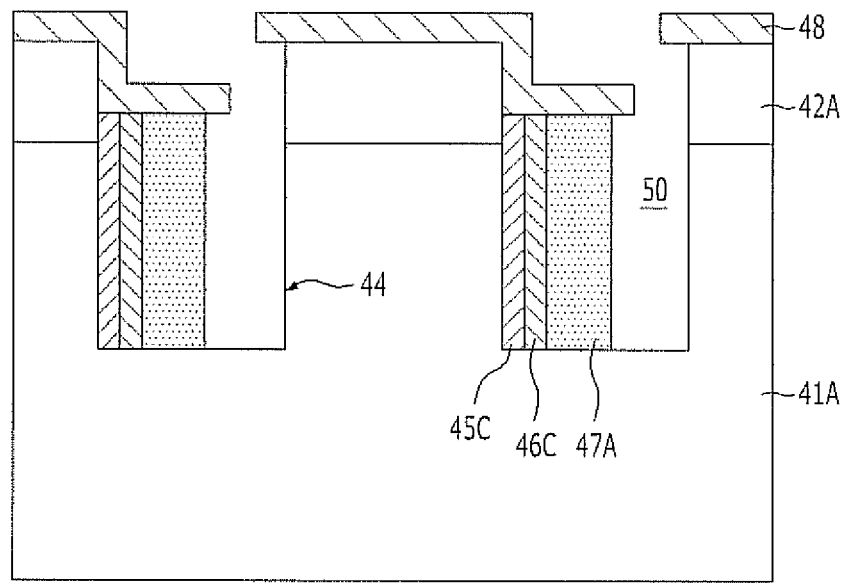
Figure 5J:
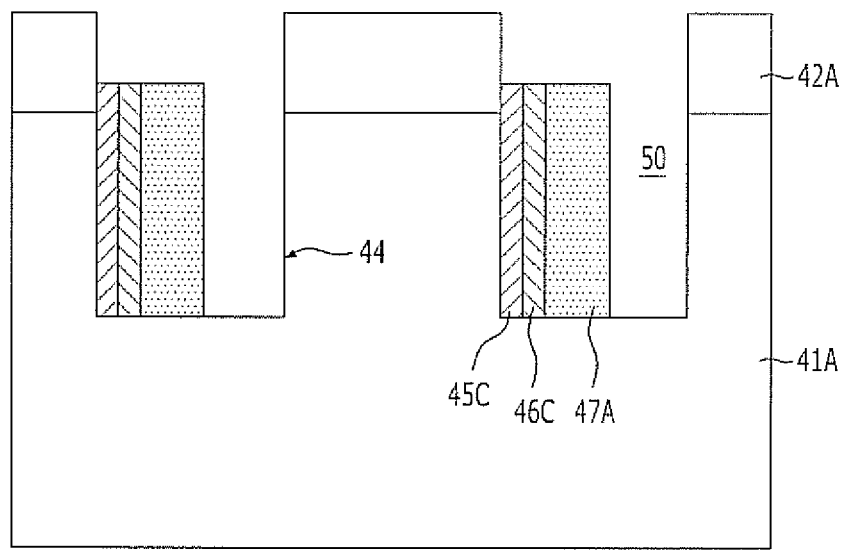
Figure 5K:
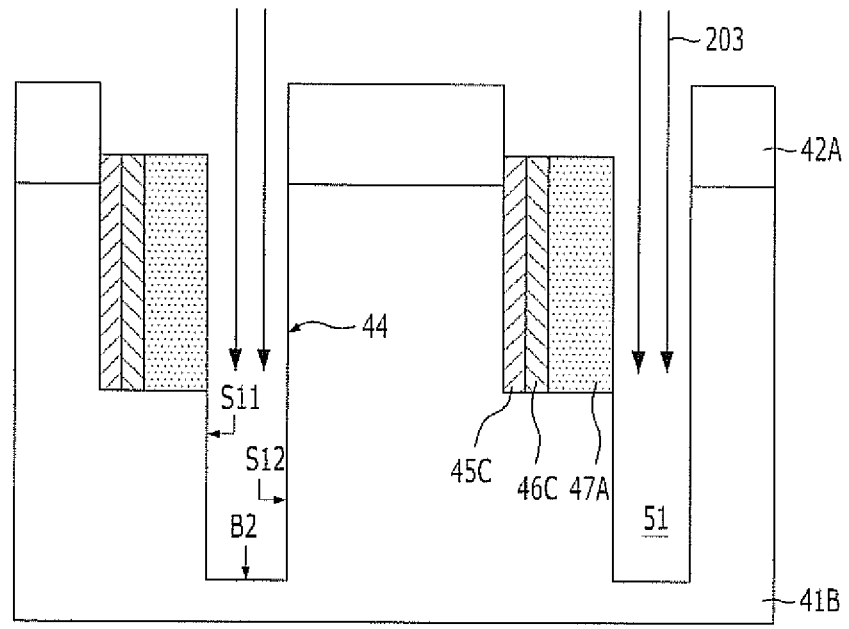
Figure 5L:
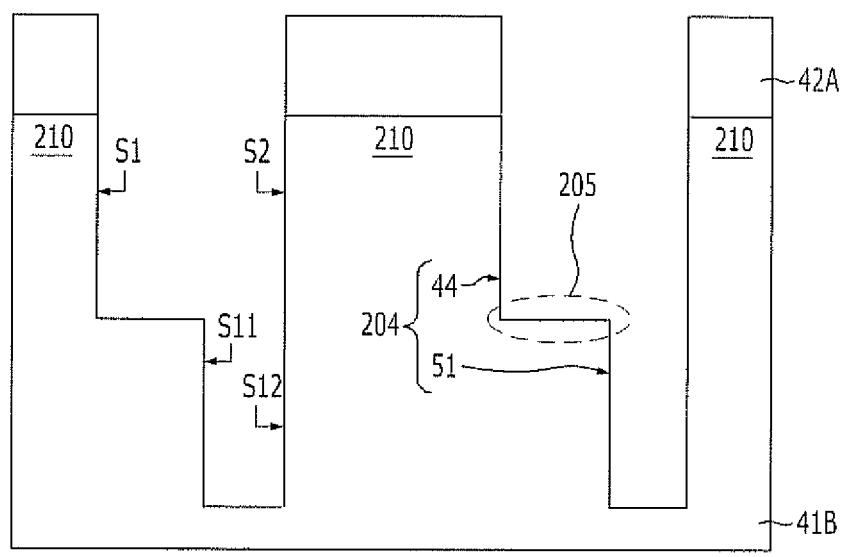
Figure 5M:
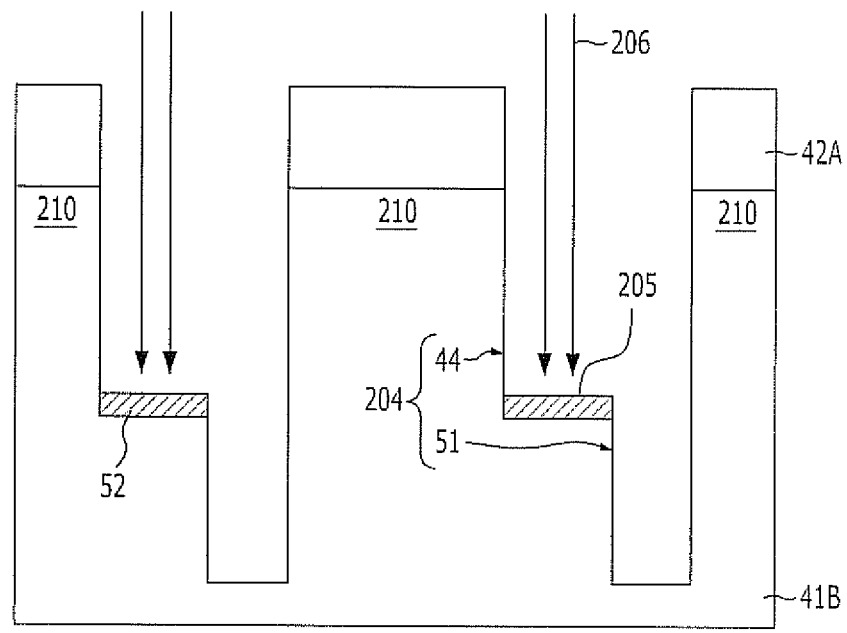
Figure 5N:
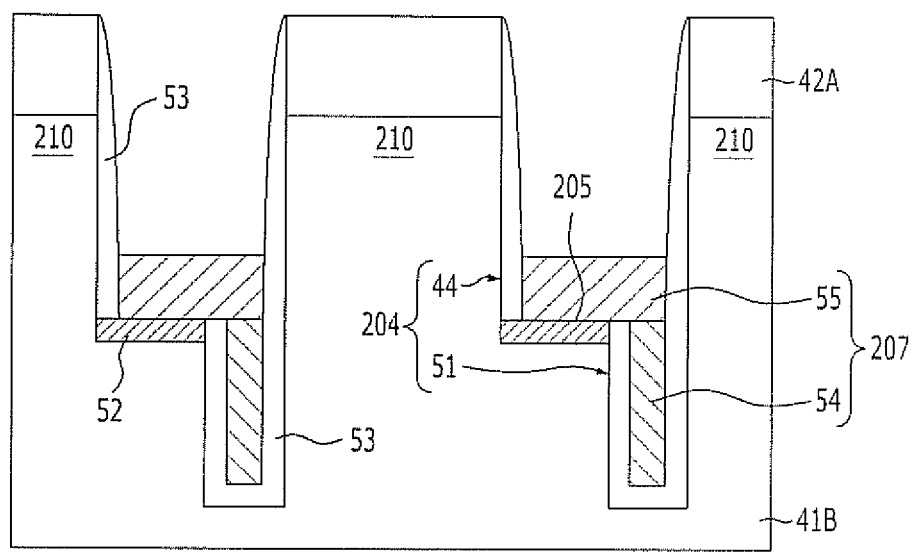

FIGS. 5A to 5N are cross-sectional views illustrating a method for fabricating the semiconductor device of FIG. 4.

Referring to FIG. 5A, a pad layer 42 is formed over a substrate 41. The substrate 41 may be a silicon substrate. The pad layer 42 includes at least one material selected from the group consisting of an oxide layer, a nitride layer, and a polysilicon layer. For example, the pad layer 42 may be a double layer, which is formed by stacking an oxide layer and a nitride layer or stacking an oxide layer and a polysilicon layer.

A hard mask pattern 43 is formed over the pad layer 42. The hard mask pattern 43 is formed by forming a hard mask layer over the pad layer 42, and etching the hard mask layer using a trench mask (not shown) as an etch barrier. The hard mask pattern 43 may include an oxide layer or a nitride layer.

Referring to FIG. 5B, a primary trench etch process 201 is performed using the hard mask pattern 43 as an etch barrier. For example, the pad layer 42 is etched using the hard mask pattern 43 as an etch barrier, and subsequently a first trench 44 is formed by etching the substrate 41 to a certain depth. The first trench 44 may be a line-type trench. That is, the first trench 44 may have a linear shape extending in a direction perpendicular to the cross-section shown in FIG. 5B.

The primary trench etch process 201 may be an anisotropic etch, which is capable of etching in a straight line. Accordingly, the primary trench etch process 201 can produce a trench with vertical sidewalls. When the substrate 41 is a silicon substrate, the anisotropic etch may include a plasma dry etch process performed using chlorine ($Cl_2$) or hydrobromide (HBO gas alone or a mixed gas thereof.

The first trench 44 is formed to have a certain first depth. For example, the first depth may be approximately half the depth of the final trench 204. The remaining depth of the final trench 204 is determined by a second trench 51 to be formed subsequently. The sidewalls of the first trench 44 have a vertical profile. As shown in FIG. 5B, the first trench 44 has a first sidewall S1, a second sidewall S2, and a bottom surface B1. The first sidewall S1 and the second sidewall S2 have vertical profiles. After the formation of the first trench 44, the substrate is denoted with reference numeral '41A,' and the pad layer is denoted with reference numeral '42A.' After the formation of the first trench 44, the hard mask pattern 43 may be removed.

Referring to FIG. 5C, a buffer layer 45 and a spacer layer 46 are sequentially formed over the substrate structure including the first trench 44. The buffer layer 45 may include an oxide layer. The spacer layer 46 may include a metallic layer, such as a titanium nitride layer. The buffer layer 45 facilitates a uniform etch during a subsequent secondary trench etch process, while protecting the sidewalls of a trench.

Referring to FIG. 5D, a spacer etch is performed. As a result, a buffer layer pattern 45A and a spacer 46A are formed on both sidewalls of the first trench 44. The spacer 46A is etched by performing an anisotropic etch. The anisotropic etch may be an etch-back process.

Referring to FIG. 5E, a filling layer 47 gap-filling the inside of the first trench 44 is formed. The filling layer 47 may be an oxide layer. After the filling layer 47 is formed, a planarization process, such as Chemical Mechanical Polishing (CMP), is performed. Herein, the CMP process may be performed in such a manner that the surface of the filling layer 47 is lower than the pad layer pattern 42A. The step height between the filling layer 47 and the pad layer pattern 42A may be increased, by forming a thicker pad layer 42 when it is initially deposited. When the filling layer 47 is formed as described above, an uneven morphology, including a prominence and depression, may be formed. During the CMP process, upper portions of the buffer layer pattern 45A and the spacer 46A are partially removed. The remaining portions of the buffer layer pattern 45A and the spacer 46A, whose heights are lowered by the CMP process, are referred to as a planarized buffer layer pattern 45B and a planarized spacer 46B, respectively.

Referring to FIG. 5F, a polysilicon layer 48 is formed thin to be deposited along the uneven morphology. Subsequently, a tilt ion implantation process 202 is performed at a tilt angle of approximately 20 to 40°.

As a result, a non-ion implantation region 48A is formed. A region where ions are implanted and a region where ions are not implanted yield different etch rates during a subsequent wet etch process. More specifically, the region where ions are not implanted is more easily etched out.

Referring to FIG. 5G, a wet etch is performed, removing the non-ion implantation region 48A. Thus, the upper portions of the planarized buffer layer pattern 45B and the planarized spacer 46B are exposed.

Referring to FIG. 5H, the exposed planarized spacer 46B is selectively removed. To remove the planarized spacer 46B, a wet etch process is performed. The wet etch process is performed using a chemical based on hydro peroxide ($H_2O_2$), when the planarized spacer 46B is titanium nitride. When the planarized spacer 46B is removed, a first recess 49 is formed. The width of the first recess 49 may be controlled to be narrow or wide by adjusting the thickness of the planarized spacer 46B when it is initially deposited. The remaining spacer is referred to as a spacer pattern 46C. The polysilicon layer 48 serves as a barrier when the planarized spacer 46B is removed.

Referring to FIG. 5I, the exposed planarized buffer layer pattern 45B is selectively removed. To remove the planarized buffer layer pattern 45B, a wet etch process is performed. The wet etch process is performed using a chemical based on hydro fluoride (HF) when the planarized buffer layer pattern 45B is an oxide layer. When the planarized buffer layer pattern 45B is removed, a second recess 50 is formed. A buffer layer pattern 45C, which is covered with the polysilicon layer 48, remains even after the wet etch process.

When a portion of the planarized buffer layer pattern 45B is removed, a portion of the filling layer 47 may be removed as well. The remaining filling layer is referred to as a filling layer pattern 47A.

Referring to FIG. 5J, the polysilicon layer 48 is removed. To this end, a wet etch process is performed. When the polysilicon layer 48 is removed, the upper portion of the second recess 50 is opened. The second recess 50 exposes a portion of the first trench 44. For example, the second recess 50 exposes any one sidewall of the first trench 44, e.g., the second sidewall S2 of the first trench 44, and a portion of the bottom surface B1 of the first trench 44.

As described above, when the deposition of the polysilicon layer 48, the tilt ion implantation 202, the removal of the planarized spacer 46B, and the removal of the planarized buffer layer pattern 45B are performed sequentially, no mask process is required.

Referring to FIG. 5K, a secondary trench etch process 203 is performed. The secondary trench etch process 203 is performed using the pad layer pattern 42A, the filling layer pattern 47A, layer pattern 45C, and the spacer pattern 46C as etch barriers. As a result of the secondary trench etch process 203, a second trench 51 of a certain depth is formed.

The secondary trench etch process 203 may be the same anisotropic etch process, which is capable of etching in a straight line, as the primary trench etch process 201. Accordingly, the secondary trench etch process 203 is a vertical etch process. When the substrate 41A is a silicon substrate, the anisotropic etch process includes a plasma dry etch process performed using chlorine ($Cl_2$) or hydrobromide (HBr) gas alone, or a mixed gas thereof.

Through the secondary trench etch process 203, the second trench 51, including a first sidewall S11, a second sidewall S12, and a bottom surface B2, is formed. The substrate with the second trench 51 is denoted with reference numeral '41B.' The second sidewall S12 of the second trench 51 has a vertical profile aligned with the second sidewall S2 of the first trench 44. The first sidewall S11 of the second trench 51 is self-aligned with the pad layer pattern 42A, the filling layer pattern 47A, the layer pattern 45C, and the spacer pattern 46C, and therefore, the first sidewall S11 is not aligned with the first sidewall S1 of the first trench 44. The first sidewall S11 of the second trench 51 has a vertical profile.

Referring to FIG. 5L, the filling layer pattern 47A, the layer pattern 45C, and the spacer pattern 46C are removed. As a result, a double-structure trench 204, including the first trench 44 and the second trench 51, is formed. Accordingly, a sidewall step 205 is formed. The first sidewall S1 and the second sidewall S2 of the first trench 44 have vertical profiles. Furthermore, the first sidewall S11 of the second trench 51 has a vertical profile and the second sidewall S12 has a vertical profile. The second sidewall S2 of the first trench 44 and the second sidewall S12 of the second trench 51 are aligned and have vertical profiles. The sidewall step 205 is formed between the first trench 44 and the second trench 51. The sidewall step 205 is a region where a junction is to be formed through a subsequent ion implantation process. A plurality of the active regions 210 are formed by the double-structure trench 204 having the sidewall step 205. The active regions 210 are isolated from each other by the double-structure trench 204. Each of the active regions 210 includes a plurality of sidewalls and any one sidewall among the plurality of the sidewalls includes the sidewall step 205.

Subsequently, a junction and a bit line are formed just as they are formed in the first embodiment.

Referring to FIG. 5M, an ion implantation process 206 is performed to form a junction 52 under the surface of the sidewall step 205. Since the sidewall step 205 is exposed, a tilt ion implantation process is not needed. Therefore, the junction 52 may be more easily formed through the ion implantation process 206, which implants ions in a vertical direction (e.g., a blanket process). Subsequently, an annealing process is performed to activate the impurity. The ion implantation process 206 is performed using an N-type impurity or a P-type impurity. The N-type impurity may include phosphorus (P) or arsenic (As), while the P-type impurity may include boron (B).

Referring to FIG. 5N, a blocking layer 53 is formed over the substrate structure, including the double-structure trench 204. The blocking layer 53 may include an oxide layer or a nitride layer.

A first conductive layer 54 is deposited over the blocking layer 53 and an etch-back process is performed. Herein, an etch target and an etch time are controlled to expose the blocking layer 53 in the upper portion of the sidewall step 205 during the etch-back process. Since the etch-back process is performed to expose the blocking layer 53 in the upper portion of the sidewall step 205, the first conductive layer 54 gap-fills the second trench 51.

The blocking layer 53 is etched to expose a portion of the sidewall step 205. To expose a portion of the blocking layer 53, a dry etch process may be used. Since a portion of the sidewall step 205 is exposed, a portion of the junction 52 is exposed. A portion of the blocking layer 53 remains on the first sidewall S1 of the first trench 44, and another portion of the blocking layer 53 remains on the second sidewall S2 of the first trench 44, the first and second sidewalls 511 and S12 of the second trench 51, and the bottom surface of the second trench 51.

Subsequently, a second conductive layer 55 contacting the junction 52 is formed. The second conductive layer 55 may include a metal layer. The second conductive layer 55 is formed by depositing a layer over the substrate structure to fill at least a part of the double-structure trench 204. Then, an etch-back process may be performed.

When the second conductive layer 55 is formed as described above, a buried bit line 207 including the first conductive layer 54 and the second conductive layer 55 is formed. The buried bit line 207 contacts the junction 52 through the second conductive layer 55. The other portions of the buried bit line 207, except the portion contacting the junction 52, are insulated from the substrate 41B by the blocking layer 53.

When the second conductive layer 55 is formed as described above, a buried bit line 207 including the first conductive layer 54 and the second conductive layer 55 is formed. The buried bit line 207 contacts the junction 52 through the second conductive layer 55. The other portion of the buried bit line 207 except the portion contacting the junction 52 is insulated by the blocking layer 53 from the substrate 41B.

The technology according to one embodiment of the present invention may remarkably decrease the number of masks used for forming buried bit lines in vertical cells and decrease the number of procedural steps. Thus, it is favorable in terms of process simplification, reduction of process difficulty, and decrease in production costs.

As mask processes are simplified, semiconductor memory devices may be more highly integrated. For example, 40 nm-class semiconductor memory devices may be obtained.

The size of a step exposed in a portion where a buried bit line is formed may be controlled by adjusting a tilt angle of a wafer, the thickness of a blocking layer, and an etch target of spacer etching.

Thin films formed of diverse metals may be used for forming buried bit lines, and the buried bit lines may be more easily isolated in the inside of a trench.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a trench having a sidewall step on one sidewall by etching a substrate;
   forming a junction under a surface of the sidewall step;
   performing an annealing process such that the junction is extended to a lower portion of the sidewall, which is located over a surface of the sidewall step; and
   forming a buried bit line contacting the junction.

2. The method of claim 1, wherein the forming of the junction is performed by an ion implantation process.

3. The method of claim 1, wherein the forming of the trench comprises:
   forming a first trench by performing a primary trench etch process onto the substrate; and
   forming a second trench for providing the sidewall step to a portion connected to the first trench by etching the substrate deeper than the first trench through a secondary trench etch process.

4. The method of claim 3, wherein the primary trench etch process and the secondary trench etch process are anisotropic etch processes.

5. The method of claim 3, wherein the secondary trench etch process is performed by tilting the substrate.

6. The method of claim 3, wherein one sidewall of the first trench and one sidewall of the second trench are aligned to have vertical profiles, and another sidewall of the first trench and another sidewall of the second trench provide the sidewall step.

7. The method of claim 3, wherein the forming of the second trench comprises:
   forming spacers covering two sidewalls of the first trench;
   tilting the substrate; and
   etching the tilted substrate.

8. The method of claim 7, wherein the tilting of the substrate is performed by tilting a stage of an etch equipment onto which the substrate is stationed.

9. The method of claim 7, wherein the tilting of the substrate is performed at a tilt angle so as to shadow one spacer among the spacers.

10. The method of claim 9, wherein the tilt angle ranges from 4° to 10° from a horizontal surface perpendicular to an etch direction of the secondary trench etch process.

11. The method of claim 7, wherein the spacers comprise an oxide layer or a nitride layer.

12. The method of claim 1, wherein the forming of the buried bit line comprises:
   forming a blocking layer over a substrate structure including the junction;
   forming a first conductive layer filling a portion of the trench;
   exposing a portion of the sidewall step by etching the blocking layer; and
   forming a second conductive layer connected to the junction at the exposed sidewall step.

13. The method of claim 12, wherein the exposing of the portion of the sidewall step comprises performing a dry etch process onto the blocking layer.

14. The method of claim 12, wherein the exposing of the portion of the sidewall step comprises opening a top surface and a side surface of the sidewall step.

15. The method of claim 12, wherein the forming of the first conductive layer and the forming of the second conductive layer each comprise a deposition process followed by etch-back.

16. A method for fabricating a semiconductor device, comprising:
   forming a first trench by etching a substrate;
   forming a sacrificial layer that exposes one sidewall of the first trench and a portion of a bottom of the first trench;
   forming a second trench that provides a sidewall step by etching the exposed portion of the bottom of the first trench;
   forming a junction under a surface of the sidewall step; and
   forming a buried bit line contacting the junction.

17. The method of claim 16, wherein the forming of the junction is performed using an ion implantation process.

18. The method of claim 16, wherein the forming the sacrificial layer comprises:
   forming a buffer layer pattern and a spacer that cover two sidewalls of the first trench;
   forming a filling layer that gap-fills the first trench having the buffer layer pattern and the spacer; and
   forming a recess that exposes one sidewall of the first trench and a portion of the bottom of the first trench by removing a portion of the buffer layer pattern and a portion of the spacer.

19. The method of claim 18, wherein the forming of the buffer layer pattern and the spacer comprises:
   depositing an oxide layer and a metallic layer; and
   performing an etch-back process onto the metallic layer and the oxide layer.

20. The method of claim 18, wherein the buffer layer pattern comprises an oxide layer, and the spacer comprises a titanium nitride layer.

21. The method of claim 18, wherein the forming of the filling layer comprises:
   forming an oxide layer over a substrate structure until the first trench, including the buffer layer pattern and the spacer, is gap-filled; and
   planarizing the oxide layer in such a manner that an upper surface of the oxide layer is lower than an upper surface of the buffer layer pattern.

22. The method of claim 18, wherein the forming the recess comprises:
   forming a polysilicon layer over a substrate structure including the filling layer;
   performing a tilt ion implantation onto the polysilicon layer;
   removing a non-ion implantation region of the polysilicon layer; and
   removing a portion of the spacer and a portion of the buffer layer by using a remaining portion of the polysilicon layer as a barrier.

23. The method of claim 16, wherein the forming of the first trench and the second trench is performed using an anisotropic etch process.

24. A method for fabricating a semiconductor device, comprising:
   forming a trench having a sidewall step on one sidewall by etching a substrate;
   forming a junction under a surface of the sidewall step; and
   forming a buried bit line contacting the junction,
   wherein the forming of the trench comprises:

forming a first trench by performing a primary trench etch process onto the substrate; and forming a second trench for providing the sidewall step to a portion connected to the first trench by etching the substrate deeper than the first trench through a secondary trench etch process, wherein the secondary trench etch process is performed by tilting the substrate.

* * * * *